United States Patent
Li et al.

(10) Patent No.: US 10,411,204 B2
(45) Date of Patent: Sep. 10, 2019

(54) FLEXIBLE DISPLAY PANEL AND METHOD FOR FABRICATING THEREOF, FLEXIBLE DISPLAY APPARATUS

(71) Applicant: Wuhan China Star Optoelectronics Semiconductor Display Technology Co., Ltd., Wuhan, Hubei (CN)

(72) Inventors: Shuang Li, Guangdong (CN); Liang Sun, Guangdong (CN)

(73) Assignee: Wuhan China Star Optoelectronics Semiconductor Display Technology Co.. Ltd., Wuhan (CN)

( * ) Notice: Subject to any disclaimer, the term of this patent is extended or adjusted under 35 U.S.C. 154(b) by 0 days.

(21) Appl. No.: 15/567,032

(22) PCT Filed: Aug. 17, 2017

(86) PCT No.: PCT/CN2017/097752
§ 371 (c)(1),
(2) Date: Oct. 16, 2017

(87) PCT Pub. No.: WO2019/006826
PCT Pub. Date: Jan. 10, 2019

(65) Prior Publication Data
US 2019/0013486 A1    Jan. 10, 2019

(30) Foreign Application Priority Data

Jul. 5, 2017 (CN) .......................... 2017 1 0543421

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3262* (2013.01); *H01L 27/3265* (2013.01); *H01L 27/3276* (2013.01); *H01L 2251/5338* (2013.01)

(58) Field of Classification Search
CPC ......... H01L 27/3276; H01L 2251/5338; H01L 51/0097
See application file for complete search history.

(56) References Cited

U.S. PATENT DOCUMENTS

| 2014/0231763 A1* | 8/2014 | Kim | .................... H01L 27/3218 257/40 |
| 2015/0029683 A1* | 1/2015 | Kim | ...................... H01L 27/326 361/749 |

(Continued)

FOREIGN PATENT DOCUMENTS

| CN | 105845701 A | 8/2016 |
| CN | 106328684 A | 1/2017 |

*Primary Examiner* — Nduka E Ojeh
(74) *Attorney, Agent, or Firm* — Andrew C. Cheng

(57) ABSTRACT

The present application discloses a flexible display panel and a method for fabricating thereof, and a flexible display apparatus. The flexible display panel including at least two non-bending regions and a bending region disposed between the at least two non-bending regions, at least one of the at least two non-bending regions is used as a display region; both the non-bending region and the bending region include the flexible substrate and the organic light emitting device layer, wherein the display region is further provided with at least one metal layer for providing a driving signal to the organic light emitting device layer, and the bending region is further provided with a buffer layer. When meeting the demand of display image in the bending region, the probability of damaging to the metal traces influenced by the bending in the bending region is reduced to increase the life time of the display panel.

15 Claims, 3 Drawing Sheets

(51) Int. Cl.
*H01L 35/24* (2006.01)
*H01L 29/08* (2006.01)

(56) References Cited

U.S. PATENT DOCUMENTS

| | | | |
|---|---|---|---|
| 2016/0190216 A1* | 6/2016 | Yang | G01B 7/18 |
| | | | 257/91 |
| 2016/0204172 A1* | 7/2016 | Park | H01L 27/3248 |
| | | | 257/40 |
| 2017/0194409 A1* | 7/2017 | Jeong | H01L 27/1218 |
| 2018/0033843 A1* | 2/2018 | Liu | G02F 1/133305 |
| 2018/0293936 A1* | 10/2018 | Fujioka | H01L 27/3262 |

\* cited by examiner

FLEXIBLE DISPLAY PANEL AND METHOD FOR FABRICATING THEREOF, FLEXIBLE DISPLAY APPARATUS

FIELD OF THE INVENTION

The present application relates to a display technology field, and more particularly to a flexible display panel and method for fabricating thereof, flexible display apparatus.

BACKGROUND OF THE INVENTION

In recent years, with the development of material technology, the display panel has been made into a flexible form. The flexible display consists of a soft material layer and is deformable and bendable display apparatus. The use of flexible display panels has many advantages, such as low power consumption, direct visualization, bendable, deformable, and so on.

For the flexible display panel of the conventional technology, the bending function of the flexibility display panel is limited by the limitations of the flexible material, the flexible structure, and the like. When the flexible display panel is bent to the direction opposite to the display panel side, the force received is a tensile stress, when it is bent to the direction of the display panel side, the force received is a compressive stress. The tensile or compressive stresses received by the flexible display during bending will cause damage to the device or driving line in the display panel, which in turn damages the display, resulting in an impact on the life of the display panel. In the conventional technology, the bending portion of the flexible display panel is usually provided as a non-display region, that is, the display pixel is not provided in the bending portion of the flexible display panel, the metal traces provided in the bending portion of the flexible display panel can be reduced, so that when the flexible display panel is bent, the probability of the bending portion to be damaged can be reduced, due to the absence of the metal traces, thereby improving the life time of the display panel. However, since the display pixel is not provided in the bending portion, the number of pixels per unit region on the display panel is reduced, and the display effect of the display panel is affected.

SUMMARY OF THE INVENTION

In view of the above, the present application provides a flexible display panel and a method for fabricating the same, and a flexible display apparatus, the flexible display panel is capable of increasing the life time of the display panel. In order to solve the above technical problems, a technical proposal of the present application is to provide a flexible display apparatus, the flexible display apparatus including a flexible display panel:

the flexible display panel including: at least two non-bending regions and a bending region disposed between two adjacent non-bending regions of the at least two non-bending regions, at least one of the at least two non-bending regions serving as a display region, a flexible substrate and a functional layer on the flexible substrate are disposed on both the bending region and the display region of the flexible display panel;

the functional layer disposed in the display region includes an organic light emitting device layer and a driving layer disposed between the flexible substrate and the organic light emitting device layer; wherein a plurality of organic light emitting display pixels are formed in the organic light emitting device layer; at least a metal layer is disposed in the driving layer for providing a driving signal to the organic light emitting display pixels;

the functional layer disposed in the bending region includes the organic light emitting device layer and a buffer layer disposed between the flexible substrate and the organic light emitting device layer;

wherein in the driving layer, the setting density of the metal layer close to the bending portion is greater than the setting density of the metal layer away from the bending portion; and wherein in the driving layer, the width of the metal layer close to the bending portion is smaller than the width of the metal layer away from the bending portion.

The present application also provide a technology approach to provide a flexible display panel, the flexible display panel including: at least two non-bending regions and a bending region disposed between two adjacent non-bending regions of the at least two non-bending regions, at least one of the at least two non-bending regions serving as a display region, a flexible substrate and a functional layer on the flexible substrate are disposed on both the bending region and the display region of the flexible display panel;

the functional layer disposed in the display region includes an organic light emitting device layer and a driving layer disposed between the flexible substrate and the organic light emitting device layer; wherein a plurality of organic light emitting display pixels are formed in the organic light emitting device layer; at least a metal layer is disposed in the driving layer for providing a driving signal to the organic light emitting display pixels; and the functional layer disposed in the bending region includes the organic light emitting device layer and a buffer layer disposed between the flexible substrate and the organic light emitting device layer.

The present application also provide a technology approach to provide a method for fabricating a flexible display panel, including:

providing a flexible substrate, wherein the flexible substrate includes at least two non-bending regions and a bending region disposed between two adjacent non-bending regions of the at least two non-bending regions, at least one of the at least two non-bending regions serving as a display region;

forming a driving layer in the display region of the flexible substrate and forming a buffer layer in the bending region of the flexible substrate; and forming an organic light emitting device layer on the driving layer and the buffer layer, wherein a plurality of organic light emitting display pixels are formed in the organic light emitting device layer, and forming at least one metal layer in the driving layer for supplying a driving signal to the plurality of organic light emitting display pixels.

The advantages of the present application is: comparing to the conventional technology, the flexible display panel of an embodiment of the present application includes at least two non-bending regions and a bending region disposed between the at least two non-bending regions, at least one of at least two non-bending regions serving as a display region; the non-bending region and the bending region of the flexible display panel all include a flexible substrate and an organic light emitting device layer, wherein the display region is further provided with at least one metal layer for providing a driving signal to the organic light emitting device layer, and the bending region is further provided with a buffer layer. By providing the organic light emitting device layer in the bending region of the flexible display panel in this application, the driving portion for driving the organic light emitting device layer in the bending region is provided in the non-bending region in the vicinity of the bending region, when meeting the demand of also display the image in the bending region, the probability of damaging to the metal traces influenced by the bending in the bending region is reduced to increase the life time of the display panel.

BRIEF DESCRIPTION OF THE DRAWINGS

In order to more clearly illustrate the embodiments of the present application or prior art, the following FIGS. will be described in the embodiments are briefly introduced. It is obvious that the drawings are merely some embodiments of the present application, those of ordinary skill in this field can obtain other FIGS. according to these FIGS. without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

Figure 1:
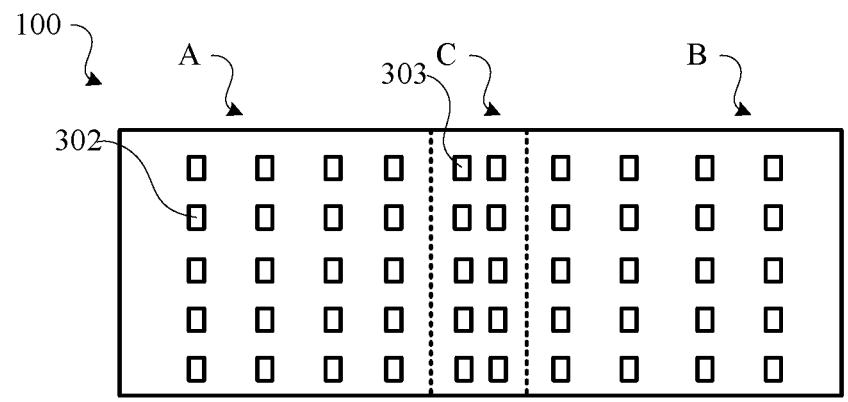
FIG. 1 is a top view of an embodiment of a flexible display panel of the present application.
Figure 2:
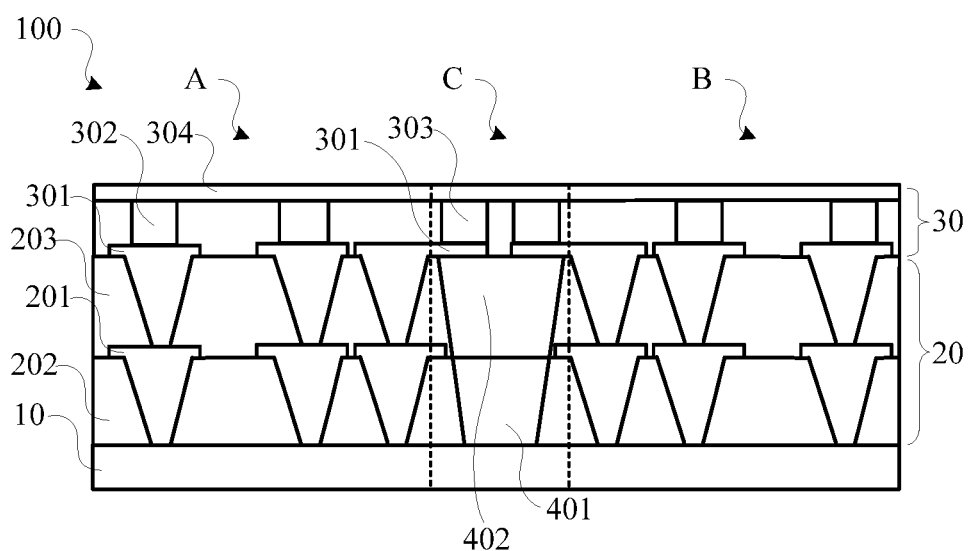
FIG. 2 is a schematic cross-sectional view of the flexible display panel shown in FIG. 1 of the embodiment.

Referring to FIGS. 1 and 2, FIG. 1 is a top view of an embodiment of a flexible display panel of the present application and FIG. 2 is a schematic cross-sectional view of the flexible display panel shown in FIG. 1 of the embodiment. As shown in FIGS. 1 and 2, the flexible display panel 100 of the present embodiment includes two non-bending regions A, B and a bending region C disposed between the two non-bending regions. In the present embodiment, the two bending regions A, B are used as display regions, flexible substrates 10 and functional layers on the flexible substrates 10 are all disposed in the bending region C and the display regions A, B of the flexible display panel. It is to be understood that, the number of the non-bending region in the flexible display panel 100 can be greater than two, the bending region is disposed between any two adjacent non-bending regions, and at least two non-bending regions can be all used as display region, or part of the non-bending region can be used as display region.

Further, as shown in FIGS. 1 and 2, the functional layer provided in the display regions A, B of the flexible display panel 100 includes an organic light emitting device layer 30 and a driving layer 20 provided between the flexible substrate 10 and the organic light emitting device layer 30. Wherein a plurality of organic light emitting display pixels 302, 303 is formed in the organic light emitting device layer 30. It is to be noted that, the organic light emitting device layer 30 is provided in the bending region C and the display regions A, B of the flexible display panel 100, therefore the organic light emitting display pixels are all disposed in the bending region C and the display regions A, B, the organic light emitting display pixels of the display regions A, B are marked as the organic light emitting display pixels 302, and the organic light emitting display pixels of the bending region are marked as the organic light emitting display pixels 303. The driving layer 20 is provided with a metal layer 201 for providing a driving signal to the organic light emitting display pixels 302 and 303. The metal layer 201 is provided in accordance with the specific requirements. It is understood that, the metal layer 201 is at least one layer. As shown in FIG. 2, the organic light emitting display pixels 302 in the non-bending regions A, B are driven by the metal layer 201 in the driving layer 20 underneath, the metal layer 201 is connected to the anode 301 of the organic light emitting display pixel 302. It is to be understood that, the anode 301 of the organic light emitting display pixel is a part of the organic light emitting device layer 30, and the organic light emitting device layer 30 is provided with a cathode 304 of the organic light emitting display pixel, the organic light emitting display pixels 302, 303 are disposed between the anode 301 and the cathode 304. In the present embodiment, the cathode 304 of the organic light emitting display pixels 302, 303 are entire covered the surface of the organic light emitting device layer 30.

Further, the functional layer provided in the bending region C of the flexible display panel 100 includes an organic light emitting device layer 30 and a buffer layer disposed between the flexible substrate 10 and the organic light emitting device layer 30. In the present embodiment, the buffer layer includes a plurality of layers of laminating disposed organic buffer layers 401, 402.

As shown in FIG. 2, the organic light emitting display pixel 303 in the bending region C is driven by the metal layer 201 in the non-bending regions A, B on both sides of the bending region C, respectively. The anode 301 of the organic light emitting display pixel 303 in the bending region C extends into the non-bending regions A, B in the vicinity of the bending region C, and is connected to the corresponding metal layer 201, respectively, so that the anode 301 is also located in the non-bending regions A, B, and the metal layer 201 can provide the driving signal to the organic light emitting display pixel 303 in the bending region C. The anode 301 includes a first portion in the bending region C and a second portion in the adjacent non-bending region A, and an area of the first portion is less than an area of the second portion.

In the present embodiment, by providing the organic light emitting device layer in the bending region of the flexible display panel in this application, the driving portion for driving the organic light emitting device layer in the bending region is provided in the non-bending region in the vicinity of the bending region, when meeting the demand of also display the image in the bending region, the probability of damaging to the metal traces influenced by the bending in the bending region is reduced to increase the life time of the display panel.

Further, as shown in FIG. 2, the metal layer 201 of the organic light emitting display pixel 303 in the organic light emitting device layer 30 for driving the bending region C is also provided in the driving layer 20 of the non-bending region A, B adjacent to the bending region C. Therefore, in the non-bending region A, B adjacent to the bending region C, the number of the metal layers 201 disposed close to the portion of the bending portion C is larger than the number of the metal layer 201 disposed in the portion away from the bending portion C, as a result, the driving layer 20 of the non-bending regions A, B, the setting density of the metal layer 201 close to the bending portion C is greater than the setting density of the metal layer 201 away from the bending portion C.

Further, in order to allow a sufficient number of metal layers 201 to be provided in the driving layer 20 of the non-bending regions A, B close to the bending portion C, the width of the metal layer 201 in the driving layer 20 close to the bending portion C is appropriately reduced, therefore, in the flexible display panel 100 of the present embodiment, the width of the metal layer 201 of the non-bending regions A, B close to the bending portion C is smaller than the width of the metal layer 201 away from the bending portion C.

Figure 3:
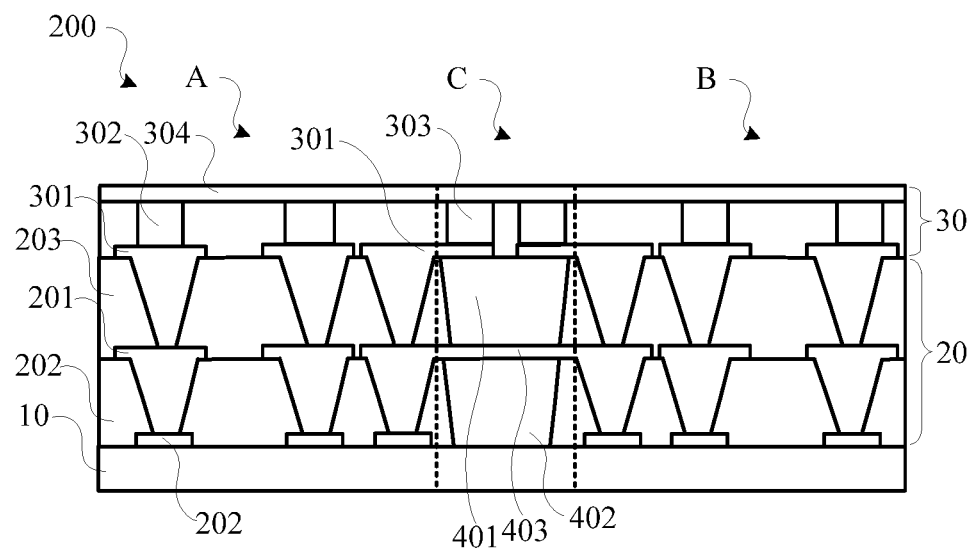
FIG. 3 is a schematic cross-sectional view of the flexible display panel shown in FIG. 1 of another embodiment.

Further, the metal layer 201 in the driving layer 20 is for supplying the driving signal to the organic light emitting display pixels 302, 303 in the organic light emitting device layer 30. In the present embodiment, the metal layer 201 in the driving layer 20 includes a polysilicon layer 202 and a scanning metal layer (not shown) disposed on the polysilicon layer 202 and a first data metal layer, wherein the scanning metal layer and the first data metal layer is insulated; the first data metal layer includes a first metal portion 201 and a second metal portion (not shown) connected the polysilicon layer 202, and the first metal portion 201 is connected to the anode 301 of the organic light emitting display pixels 302, 303 (It is to be understood that, the metal layer 201 shown in FIGS. 2 and 3 is the first metal portion of the first data metal layer), the second metal portion is used to supply the data signal to the corresponding organic light emitting display pixels 302, 303. As described above, the scanning metal layer, the polysilicon layer 202, and the first data metal layer constitute the thin film transistor and the array line in the flexible display panel 100; wherein the gate of the thin film transistor is formed while the scanning metal line is formed the scanning line, the polysilicon layer 202 forms the channel portion of the thin film transistor, the first metal portion and the second metal portion of the first data metal layer respectively form the source and drain of the thin film transistor; wherein the first metal portion 201 connected to the anode 301 of the organic light emitting display pixels 302 and 303 is the drain of the thin film transistor, and the second metal portion used for supplying data signal to the corresponding organic light emitting display pixels is the source of the thin film transistor. Referring to FIGS. 2 and 3, an inorganic layer 202 is disposed between the metal layer 201 and the flexible substrate 10 in the driving layer 20, the scanning metal layer, the polysilicon layer 202, and the first data metal layer are disposed between the inorganic layer 202. Between the metal layer 201 and the anode 301 of the organic light emitting display pixel 302 is an organic layer 203, wherein the organic layer 203 and the buffer layer 401 can be the same organic structure layer.

It is to be understood that, the organic light emitting display pixels 302, 303 in the organic light emitting device layer 30 are a plurality of pixel units distributed in an array, the driving circuits of each pixel unit are relatively independent, each of the organic light emitting display pixels 302, 303 is corresponding to a group of driving circuits. In other words, the plurality of thin film transistors and the array lines composed by the polysilicon layer 202, the scanning metal layer and the first data metal layer is corresponding to the organic light emitting display pixels 302, 303 in the organic light emitting device layer 30 in a one-to-one correspondence. Further, since the driving layer 20 is not provided in the bending region C, and is replaced by the buffer layers 401 and 402 between the organic light emitting device layer 30 and the flexible substrate 10 in the bending region C. Therefore, a driving circuit for driving the organic light emitting display pixel 303 in the bending region C is provided in the non-bending regions A, B adjacent to the bending region C. The anode 301 of the organic light emitting display pixel 303 in the bending region C is extended to the adjacent non-bending region A or the non-bending region B, and is connected to the corresponding first metal portion 201 in the non-bending region A or the non-bending region B, so that the anode 301 of the organic light emitting display pixel 303 in the bending region C is extended to the adjacent non-bending region A and/or the non-bending region B, and is connected to the drain of the thin film transistor used for driving the organic light emitting display pixel 303 in the non-bending region A and/or the non-bending region B.

Further, a capacitive metal layer (not shown) is further disposed on the polysilicon layer of the driving layer 20 in the metal layer of the driving layer 20 in the non-bending region A, B.

Further, since the driving layer 20 is not disposed in the bending region C, in order to make the data signal supplied to the organic light emitting display pixel 303 in the bending region C to be coherent and not being interrupted, as shown in FIG. 3, in another embodiment of the flexible display panel shown in FIG. 1, a second data metal layer 403 is disposed in the buffer layers 401, 402 of the bending region C, the second data metal layer 403 is connected to the second metal portion 201 of the first data metal layer corresponding to the two sides of the bending region C, respectively, such as is connected to the source of the thin film transistor for driving the organic light emitting display pixel 303.

In the present embodiment, the second data line metal layer 403 is disposed between the pluralities of organic buffer layers 401, 402. The organic buffer layers 401, 402 is capable of releasing the stress generated when the bending region C is bent, the second data line metal layer 403 is disposed between the plurality of organic buffer layers 401, 402, further when the bending region C is bent, to proceed protecting to the second data line metal layer, therefore improving the bending performance of the bending portion C, so that the bending region is less likely to be damaged by the influence of bending.

Figure 4:
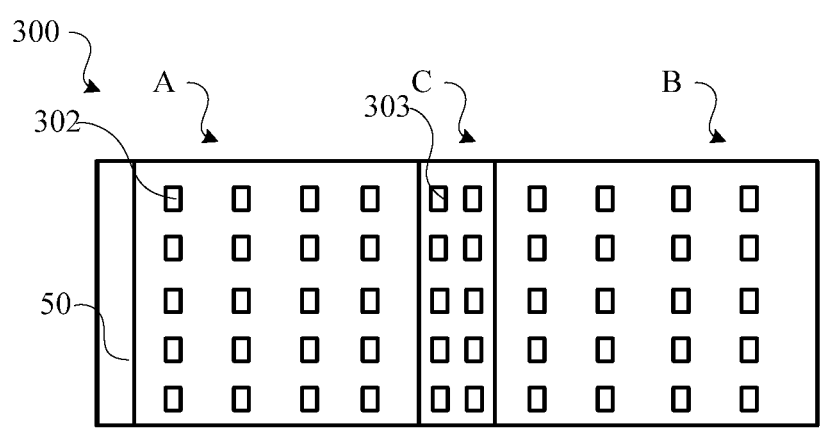
FIG. 4 is a top view of another embodiment of the flexible display panel of the present application.

Further, as shown in FIG. 4, the flexible display panel of the present embodiment further includes a flexible circuit board 50, the flexible circuit board 50 is disposed at the edge of the flexible substrate 10, and is connected to the driving layer 20 for supplying to the driving signal to the driving layer 20.

Figure 5:
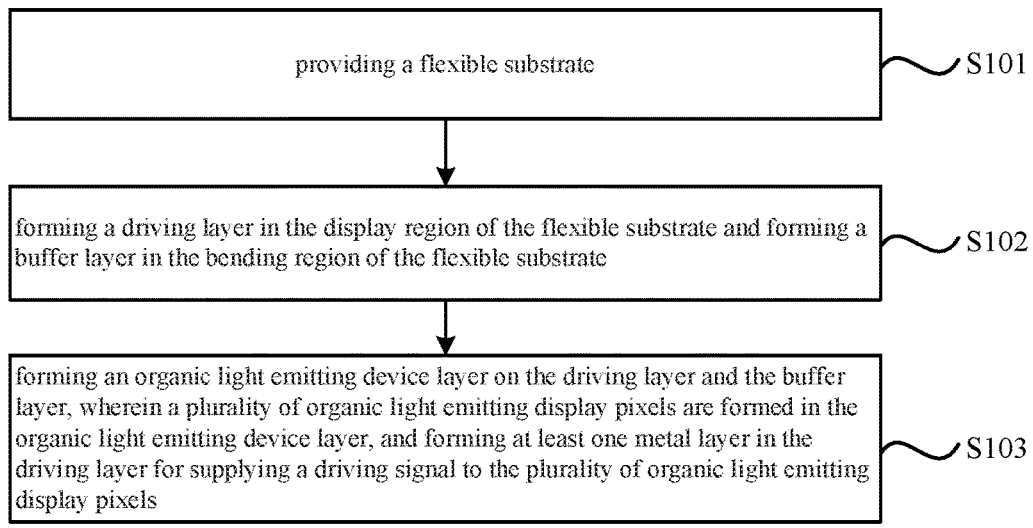
FIG. 5 is a schematic flow diagram of an embodiment of a method for fabricating the flexible display panel of the present application.

Referring to FIG. 5, FIG. 5 is a schematic flow diagram of an embodiment of a method for fabricating the flexible display panel of the present application; As shown in FIG. 5, the method for fabricating the flexible display panel of the present embodiment may include the steps of: S101, providing a flexible substrate.

In the present embodiment, the flexible substrate 10 includes two non-bending regions A, B as shown in FIGS. 1 and 2 and a bending region C disposed between the two non-bending regions A, B, wherein both of the non-bending regions A, B are used as display regions.

In other embodiments, the non-bending regions of the flexible substrate can also be greater than two, the bending region is between each two of the plurality of non-bending regions; the plurality of non-bend regions can be used as a display region, or only partial of the non-bending regions can be used as the display region.

S102, forming a driving layer in the display region of the flexible substrate, and forming a buffer layer in the bending region of the flexible substrate.

The driving layer is used for forming the driving circuit, the buffer layer is disposed in the bending region of the flexible substrate for releasing the stress generated at the bending region when the bending region is deformed, therefore proceed to protect the bending region to prevent the bending region from being damaged by the presence of stress.

S103, forming an organic light emitting device layer on the driving layer and the buffer layer; wherein a plurality of organic light emitting display pixels is formed in the organic light emitting device layer, at least one metal layer if formed in the driving layer for providing a driving signal to the plurality of organic light emitting display pixels.

The organic light emitting device layer is formed on the driving layer of the non-bending region and the buffer layer of the bending region. The plurality of organic light emitting display pixels is formed in the organic light emitting display layer, it is understood that, the organic light emitting display pixel formed in the organic light emitting device layer is one by one corresponding to the driving circuit in the driving layer, that is, an organic light emitting display pixel corresponds to a driving circuit. The driving circuit includes a scanning metal layer, a polysilicon layer and a first data metal layer disposed in the driving layer of the non-bending region, wherein the first data metal layer includes a first metal portion and a second metal portion, the first metal portion and the first metal portion are connected by the polysilicon layer, the first metal portion is also connected to the anode of the organic light emitting display pixel, the second metal portion is for supplying a data signal to the corresponding organic light emitting display pixel. It can be seen from the structure of the scanning metal layer, the polysilicon layer and the first data metal layer, the scanning metal layer, the polysilicon layer, and the first data metal layer constitute the thin film transistor of the organic light emitting display pixel. In addition, the metal layer in the driving layer of the non-bending region further includes a capacitive metal layer disposed on the polysilicon layer of the driving layer.

Further, since the driving circuit of the organic light emitting display pixel in the bending region is also disposed in the non-bending region adjacent to the bending region, therefore, the anode of the organic light emitting display pixel in the bending region need to be extended toward the non-bending region adjacent to the bend region, and to be connected to the corresponding first metal portion, so as to be able to provide the driving signal to the organic light emitting display pixel in the bending region through the driving circuit disposed in the non-bending region.

Further, a second data metal layer is disposed in the buffer layer in the bending region, the second data metal layer is used for connecting the second metal portion of the first data metal layer corresponding to the two sides of the bending region. It is to be understood that, the second metal portion connected to the second data metal layer is the second metal portion for supplying the driving signal to the organic light emitting display pixels in the bending region.

Figure 6:
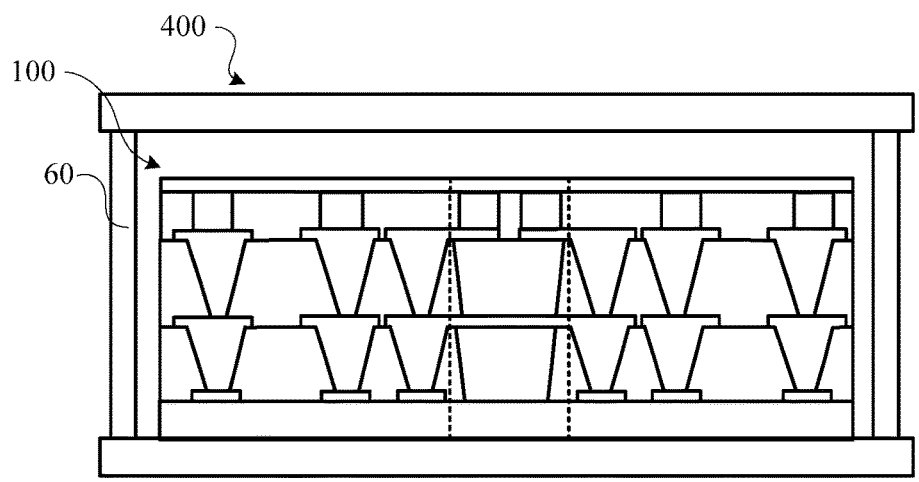
FIG. 6 is a schematic structural view of an embodiment of the flexible display device of the present application.

On the other hand, the present application also provides an embodiment of a flexible display apparatus, as shown in FIG. 6, the flexible display apparatus 400 includes the flexible display panel 100 as shown in FIGS. 1 to 4, and further includes a package structure 60 for the flexible display panels 100, the package structure 60 is used for encapsulating and protecting the flexible display panel 100.

Above are embodiments of the present application, which does not limit the scope of the present application. Any modifications, equivalent replacements or improvements within the spirit and principles of the embodiment described above should be covered by the protected scope of the invention.

What is claimed is:

1. A flexible display apparatus, wherein the flexible display apparatus comprising a flexible display panel, the flexible display panel comprising:
   at least two non-bending regions and a bending region disposed between two adjacent non-bending regions of the at least two non-bending regions, at least one of the at least two non-bending regions serving as a display region, a flexible substrate and a functional layer on the flexible substrate are disposed on both the bending region and the display region of the flexible display panel;
   the functional layer disposed in the display region comprises an organic light emitting device layer and a driving layer disposed between the flexible substrate and the organic light emitting device layer; wherein a plurality of organic light emitting display pixels are formed in the organic light emitting device layer; at least a metal layer is disposed in the driving layer for providing a driving signal to the organic light emitting display pixels; and the metal layer is connected to an anode, the anode is located in the bending region and extends to an adjacent non-bending region, so that the anode is also located in the adjacent non-bending region;
   the functional layer disposed in the bending region comprises the organic light emitting device layer and a buffer layer disposed between the flexible substrate and the organic light emitting device layer;
   wherein in the driving layer, a setting density of the metal layer close to the bending portion is greater than a setting density of the metal layer away from the bending portion; and wherein in the driving layer, a width of the metal layer close to the bending portion is smaller than a width of the metal layer away from the bending portion;
   the anode comprises a first portion in the bending region and a second portion in the adjacent non-bending region, and an area of the first portion is less than an area of the second portion.

2. The flexible display apparatus according to claim 1, wherein the metal layer in the driving layer comprises a polysilicon layer and a scanning metal layer disposed on the polysilicon layer and a first data metal layer, wherein the scanning metal layer and the first data metal layer is insulated; the first data metal layer comprises a first metal portion and a second metal portion connected to the polysilicon layer, the first metal portion is connected to the anode of the organic light emitting display pixels, the second metal portion is used to supply a data signal to the corresponding organic light emitting display pixels.

3. The flexible display apparatus according to claim 2, wherein the metal layer of the driving layer further comprises a capacitive metal layer disposed on the polysilicon layer of the driving layer.

4. The flexible display apparatus according to claim 1, wherein a second data metal layer is disposed in the buffer layer of the bending region, the second data metal layer is connected to the second metal portion of the first data metal layer corresponding to the both sides of the bending regions, respectively.

5. The flexible display apparatus according to claim 4, wherein buffer layer comprises a plurality of layers of organic buffer layers laminating stacked, and the second data metal layer is disposed between the plurality of organic buffer layers.

6. The flexible display panel according to claim 1, wherein the flexible display panel further comprises: a flexible circuit board provided at an edge of the flexible substrate and connected to the driving layer for supplying a driving signal to the driving layer.

7. A flexible display panel, comprising:
at least two non-bending regions and a bending region disposed between two adjacent non-bending regions of the at least two non-bending regions, at least one of the at least two non-bending regions serving as a display region, a flexible substrate and a functional layer on the flexible substrate are disposed on both the bending region and the display region of the flexible display panel;
the functional layer disposed in the display region comprises an organic light emitting device layer and a driving layer disposed between the flexible substrate and the organic light emitting device layer; wherein a plurality of organic light emitting display pixels are formed in the organic light emitting device layer; at least a metal layer is disposed in the driving layer for providing a driving signal to the organic light emitting display pixels; and the metal layer is connected to an anode, the anode is located in the bending region and extends to an adjacent non-bending region, so that the anode is also located in the adjacent non-bending region; and
the functional layer disposed in the bending region comprises the organic light emitting device layer and a buffer layer disposed between the flexible substrate and the organic light emitting device layer;
the anode comprises a first portion in the bending region and a second portion in the adjacent non-bending region, and an area of the first portion is less than an area of the second portion.

8. The flexible display panel according to claim 7, wherein in the driving layer, a setting density of the metal layer close to the bending portion is greater than a setting density of the metal layer away from the bending portion.

9. The flexible display panel according to claim 7, wherein in the driving layer, a width of the metal layer close to the bending portion is smaller than a width of the metal layer away from the bending portion.

10. The flexible display panel according to claim 7, wherein the metal layer in the driving layer comprises a polysilicon layer and a scanning metal layer disposed on the polysilicon layer and a first data metal layer, wherein the scanning metal layer and the first data metal layer is insulated; the first data metal layer comprises a first metal portion and a second metal portion connected to the polysilicon layer, the first metal portion is connected to the anode of the organic light emitting display pixels, the second metal portion is used to supply a data signal to the corresponding organic light emitting display pixels.

11. The flexible display panel according to claim 10, wherein the metal layer of the driving layer further comprises a capacitive metal layer disposed on the polysilicon layer of the driving layer.

12. The flexible display panel according to claim 7, wherein a second data metal layer is disposed in the buffer layer of the bending region, the second data metal layer is connected to the second metal portion of the first data metal layer corresponding to the both sides of the bending regions, respectively.

13. The flexible display panel according to claim 12, wherein buffer layer comprises a plurality of layers of organic buffer layers laminating stacked, and the second data metal layer is disposed between the plurality of organic buffer layers.

14. The flexible display panel according to claim 7, wherein the flexible display panel further comprises: a flexible circuit board provided at an edge of the flexible substrate and connected to the driving layer for supplying a driving signal to the driving layer.

15. A method for fabricating a flexible display panel, comprising:
providing a flexible substrate, wherein the flexible substrate comprises at least two non-bending regions and a bending region disposed between two adjacent non-bending regions of the at least two non-bending regions, at least one of the at least two non-bending regions serving as a display region;
forming a driving layer in the display region of the flexible substrate and forming a buffer layer in the bending region of the flexible substrate;
forming an organic light emitting device layer on the driving layer and the buffer layer, wherein a plurality of organic light emitting display pixels are formed in the organic light emitting device layer;
forming at least one metal layer in the driving layer for supplying a driving signal to the plurality of organic light emitting display pixels; and
forming an anode that is connected to the metal layer, wherein the anode is located in the bending region and extends to an adjacent non-bending region, such that the anode is also located in the adjacent non-bending region; the anode comprises a first portion in the bending region and a second portion in the adjacent non-bending region, and an area of the first portion is less than an area of the second portion.

* * * * *